(12) United States Patent
Peng et al.

(10) Patent No.: US 6,548,394 B1
(45) Date of Patent: Apr. 15, 2003

(54) METHOD OF FORMING CONTACT PLUGS

(75) Inventors: Hsin-Tang Peng, Hsinchu Hsien (TW); Yung-Ching Wang, Kaohsiung Hsien (TW)

(73) Assignee: Promos Technologies, Inc., Hsinchu (TW)

( * ) Notice: Subject to any disclaimer, the term of this patent is extended or adjusted under 35 U.S.C. 154(b) by 0 days.

(21) Appl. No.: 10/061,646

(22) Filed: Feb. 1, 2002

(30) Foreign Application Priority Data

Oct. 26, 2001 (TW) ............................... 90126528

(51) Int. Cl.⁷ .......................................... H01L 21/4763
(52) U.S. Cl. ...................... 438/618; 438/587; 438/624; 438/625; 438/637; 438/645; 438/672; 257/296; 257/906
(58) Field of Search ................................ 438/587, 589, 438/618, 624, 626, 637, 645, 672; 257/296, 906

(56) References Cited

U.S. PATENT DOCUMENTS 6,090,697 A * 7/2000 Xing et al. ................. 438/618
6,121,128 A * 9/2000 Hakey et al. ............... 438/620

* cited by examiner

*Primary Examiner*—Kamand Cuneo
*Assistant Examiner*—Lisa Kilday
(74) *Attorney, Agent, or Firm*—Merchant & Gould; Tim Tingkang Xia

(57) ABSTRACT

A method of forming contact plugs is used on a semiconductor substrate with at least four adjacent gate conducting structures, wherein a second gate conducting structure and a third gate conducting structure are formed within an active area. First, the gap between the second gate conducting structure and the third gate conducting structure is filled with a first conductive layer. Then, an inter-layered dielectric (ILD) layer with a planarized surface is formed on the entire surface of the substrate to cover the first conductive layer. Next, a bitline contact hole is formed in the ILD layer to expose the first conductive layer. Thereafter, the bitline contact hole is filled with a second conductive layer to serve as a bitline contact plug.

11 Claims, 18 Drawing Sheets

METHOD OF FORMING CONTACT PLUGS

BACKGROUND OF THE INVENTION

1. Field of the Invention

The present invention relates to a semiconductor process and, more particularly, to a method of forming a bitline contact plug.

2. Description of the Related Art

When manufacturing memory products such as trench-type DRAM, stacked-type DRAM and FLASH memory, in order to reduce the size of a chip, the conventional semiconductor process uses self-aligned contact (SAC) technology to define a reduced distance between two adjacent gate conducting structures.

FIGS. 1A to 1H are sectional diagrams showing a conventional method of forming contact plugs using SAC process. As shown in FIG. 1A, a P-type silicon substrate 10 is provided with a plurality of shallow trench isolation (STI) regions 12 in the substrate 10 for isolating adjacent active areas (AA), a gate insulating layer 14 formed on the substrate 10, a plurality of gate conducting structures 161, 162, 163 and 164 patterned on the gate insulating layer 14, and a plurality of $N^-$-type ion implantation regions 20 formed in the substrate 10 and at lateral regions of the gate conducting structures 161–164. Each of the gate conducting structures 161–164 is stacked by a polysilicon layer 17, a tungsten silicide layer 18, and a silicon nitride cap layer 19. As shown in FIG. 1B, a silicon oxide spacer 22 is grown on the sidewalls of the polysilicon layer 17 and the tungsten silicide layer 18, and then a silicon nitride spacer 24 is formed on the sidewalls of the gate conducting structures 161–164. Next, using ion implantation with the gate conducting structures 161–164 and the silicon nitride spacer 24 as the mask, an $N^+$-type ion implantation region 26 is formed in the exposed $N^-$-type ion implantation region 20. Thereby, the $N^+$-type ion implantation region 26 serves as a source/drain region, and the remaining $N^-$-type ion implantation region 20 serves as a lightly doped drain (LDD) structure.

As shown in FIG. 1C, a SiON liner 28 is deposited on the entire surface of the substrate 10, and then an inter-layered dielectric (ILD) layer 30 with a planarized surface is formed on the SiON liner 28 to fill the gaps between adjacent gate conducting structures 161–164 by deposition and chemical mechanical polishing (CMP). Preferably, the ILD layer 30 is BPSG, HDP oxide, TEOS. Next, as shown in FIG. 1D, using a first photoresist layer 31 with a pattern of the bitline contact plug formed as the mask, the ILD layer 30 and the SiON liner 28 formed between the two gate conducting structures 162 and 163 are removed to expose the $N^+$-type ion implantation region 26, thus forms a bitline contact hole 32. Thereafter, as shown in FIG. 1E, after removing the first photoresist layer 31, a first conductive layer is deposited to fill the bitline contact hole 32 and then etched back to a predetermined height within the bitline contact hole 32, thus the first conductive layer remaining in the bitline contact hole 32 serves as a bitline contact plug 34.

As shown in FIG. 1F, using a second photoresist layer 35 with a pattern of interconnection contact plugs as the mask, part of the ILD layer 30, the SiON liner 28 and the silicon nitride cap layer 19 is removed to form a first interconnection contact hole 36 and a second interconnection contact hole 38. The first interconnection contact hole 36 is formed over the first gate conducting structure 161 to expose the top of the tungsten silicide layer 18. The second interconnection contact hole 38 is formed outside the gate conducting structure 164 to expose the $N^+$-type ion implantation region 26. Next, as shown in FIG. 1G, after removing the second photoresist layer 35, a third photoresist layer 39 with a pattern of interconnections is employed as a mask to etch predetermined regions of the ILD layer 30. Finally, as shown in FIG. 1H, a second conductive layer 40 is deposited on the entire surface of the substrate 10 to fill the first interconnection contact hole 36 and the second interconnection contact hole 38. Then, CMP is employed to level off the top of the second conductive layer 40 and the top of the ILD layer 30. Therefore, the second conductive layer 40 formed on the ILD layer 30 serves as an interconnection structure 40a, and the second conductive layer 40 formed in the first/second interconnection contact hole 36/38 serves as a first/second interconnection contact plug 40b.

However, the above-described SAC process has disadvantages as listed below. First, when the STI region 12 is very large or a problem of step height between AA and STI causes misalignment during photolithography or CMP cannot provide the ILD layer 30 with an appropriate thickness and superior flatness, the etched profile of the contact hole would be affected, and it would cause problems of the interconnection structure, such as a short circuit between bitline and wordline or a blind window in the bitline contact hole 32. Second, since the etching selectivity from the ILD layer 30 to the SiON liner 28 is not large enough to provide etching stop capability during the formation of the bitline contact hole 32, seams are probably formed in the STI region 12 to cause junction leakage between the bitline contact plug 34 and the substrate 10. Third, the silicon nitride cap layer 19 requires a thick thickness in the SAC process, thus thermal budget is increased and electrical properties, such as $V_t$, $I_{dsat}$, $I_{off}$, are worsened. Fourth, if the SAC process is applied to manufacture a device of a further reduced size, the problems encountered in photolithography becomes more difficult. Fifth, the materials used for the cap layer 19 and the spacer 24 are limited to SiN or SiON, resulting in worsening the leakage problem in the polysilicon layer 17.

SUMMARY OF THE INVENTION

The present invention is a method of forming contact plugs to solve the above-mentioned problems.

The method of forming contact plugs is used on a semiconductor substrate with at least four adjacent gate conducting structures, wherein a second gate conducting structure and a third gate conducting structure are formed within an active area. First, the gap between the second gate conducting structure and the third gate conducting structure is filled with a first conductive layer. Then, an inter-layered dielectric (ILD) layer with a planarized surface is formed on the entire surface of the substrate to cover the first conductive layer. Next, a bitline contact hole is formed in the ILD layer to expose the first conductive layer. Thereafter, the bitline contact hole is filled with a second conductive layer to serve as a bitline contact plug.

Accordingly, it is a principle object of the invention to prevent the formation of the bitline contact hole from poor etching profile, short circuits in the interconnection structure and blind window.

It is another object of the invention to prevent the formation of seams in the STI region.

Yet another object of the invention is to provide a stable contact resistance between the bitline contact plug and the substrate.

It is a further object of the invention to reduce thermal budget and promote electrical properties of the product.

Still another object of the invention is to be applied to manufacture a device of a further reduced size without encountering problems in photolithography.

Another object of the invention is to increases the selectiveness of using materials.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
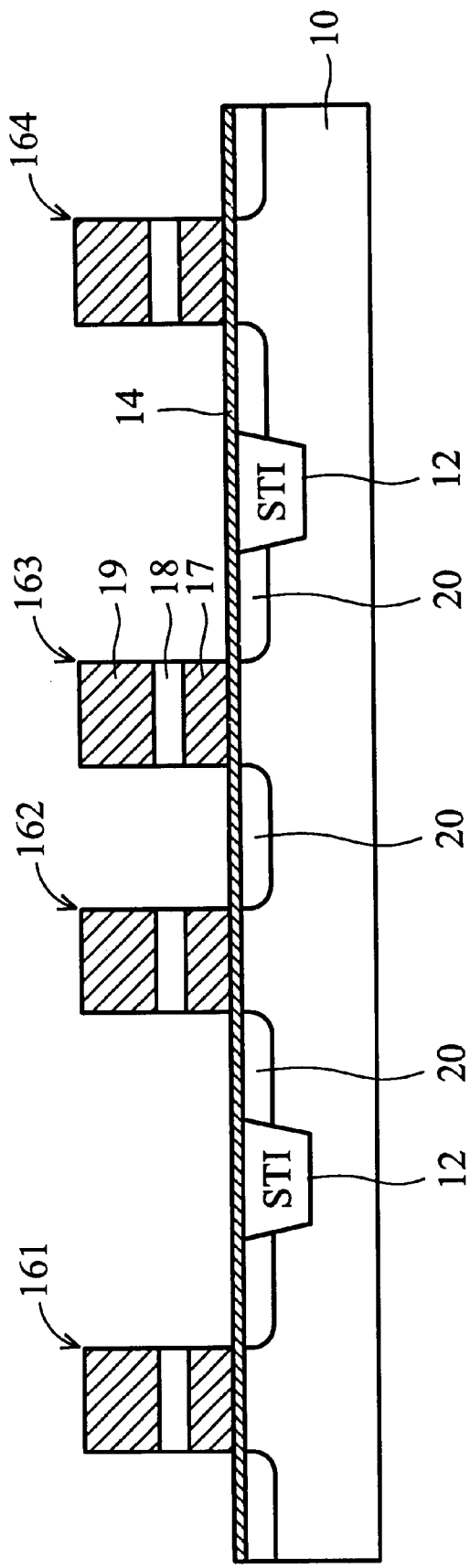
FIGS. 1A to 1H are sectional diagrams showing a conventional method of forming contact plugs using SAC process.
Figure 1B:
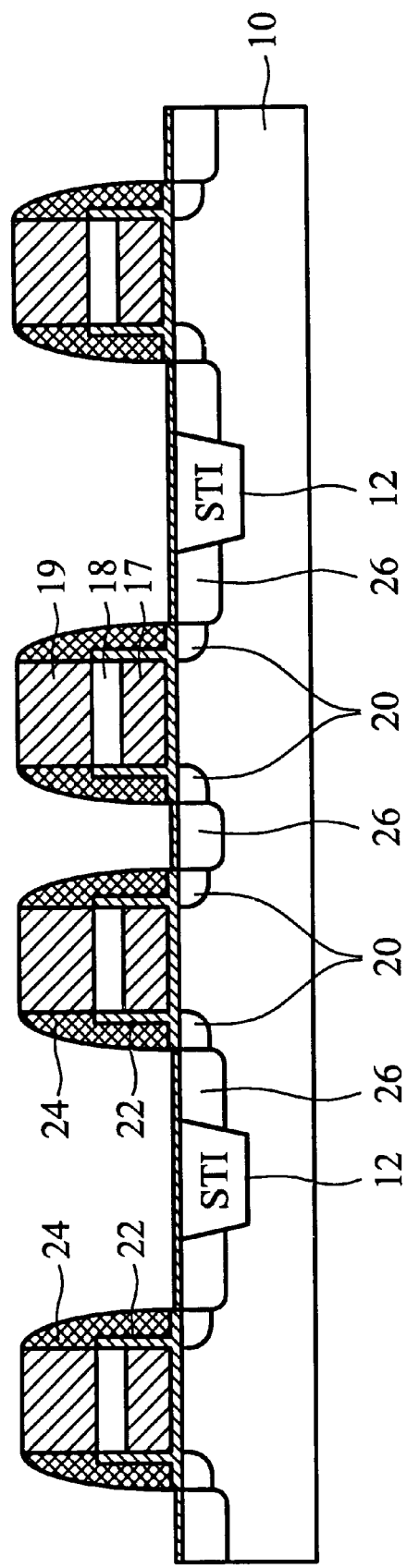
Figure 1C:
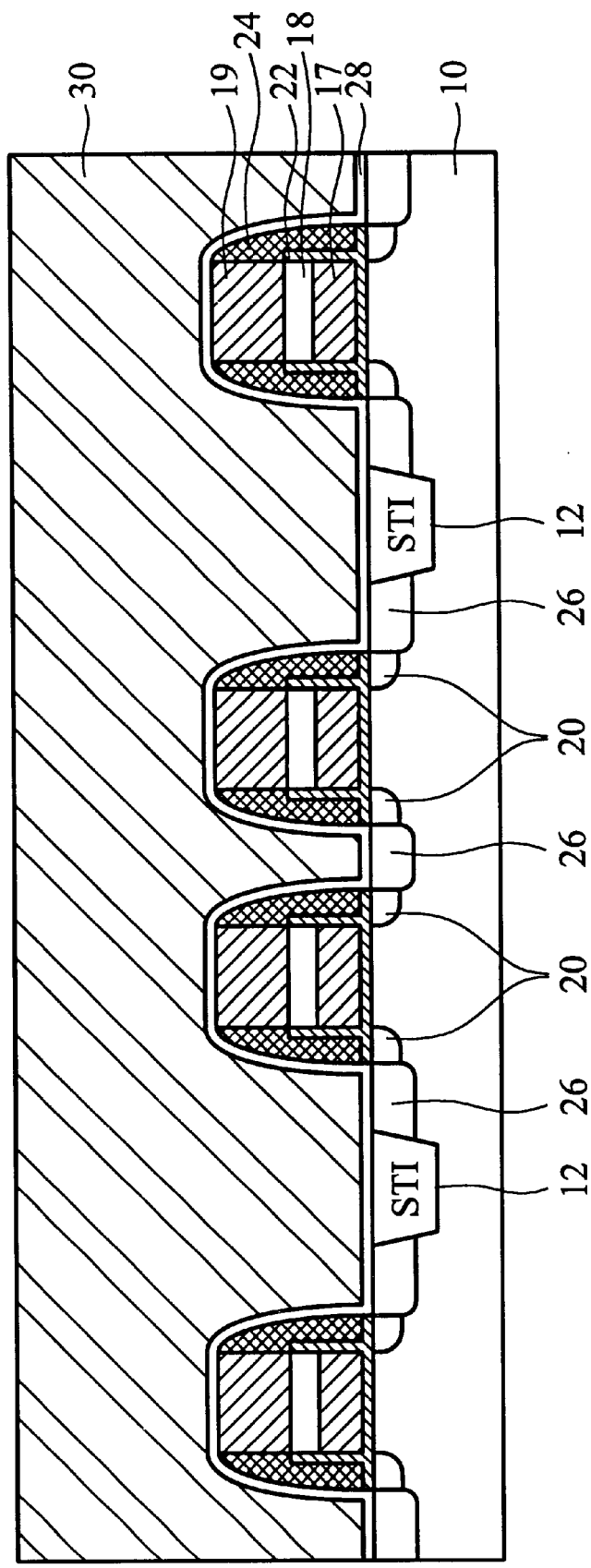
Figure 1D:
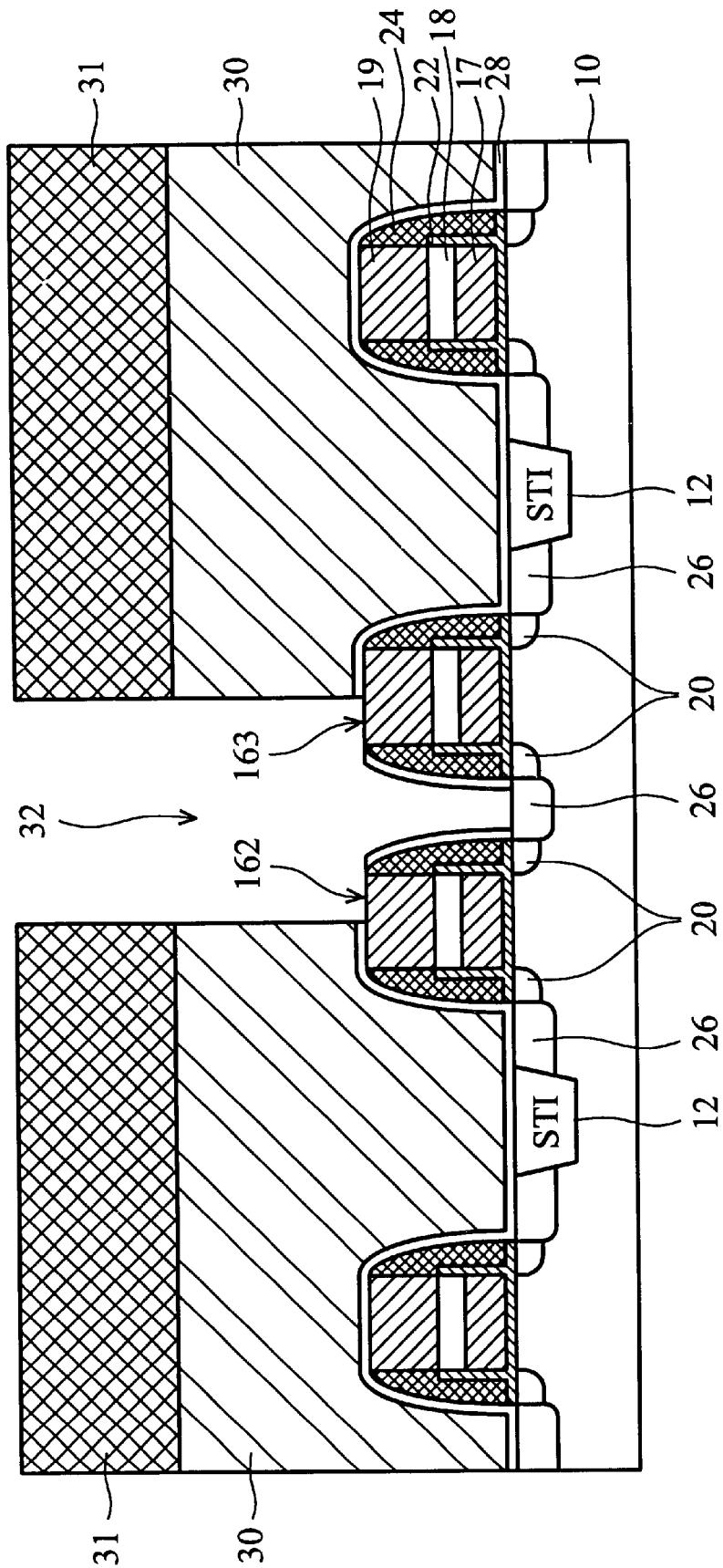
Figure 1E:
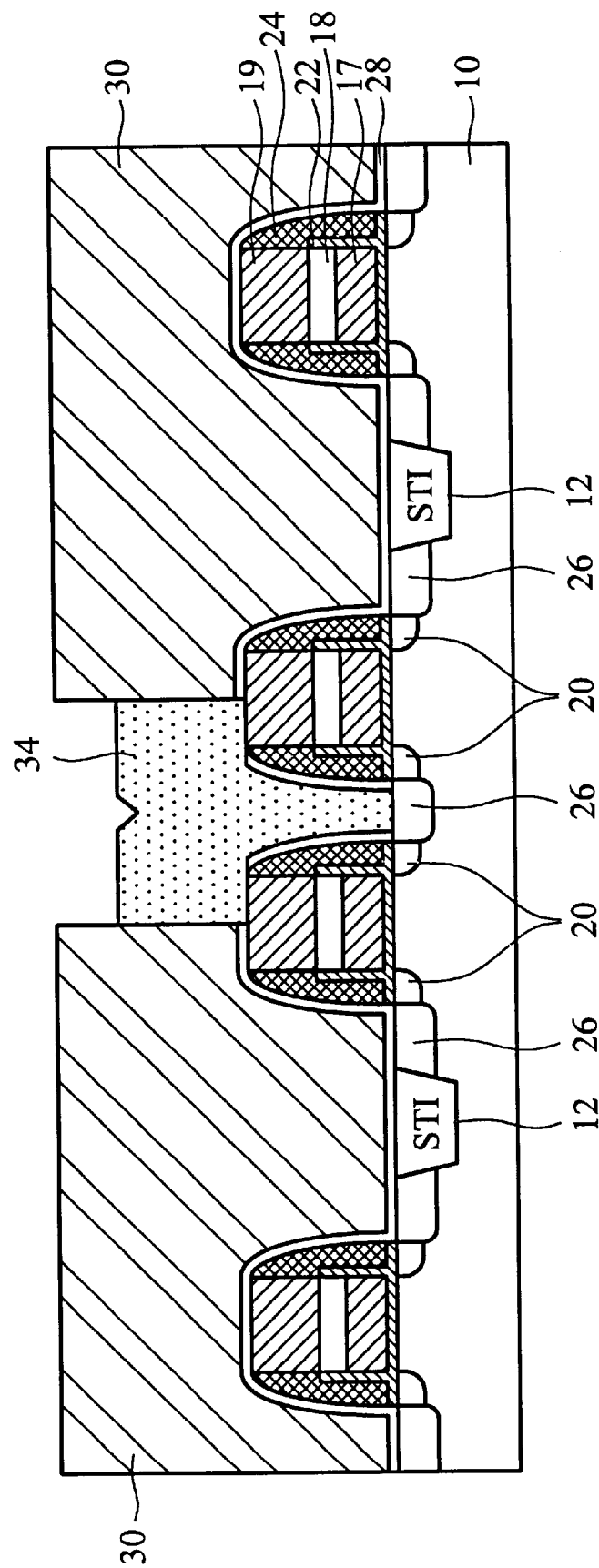
Figure 1F:
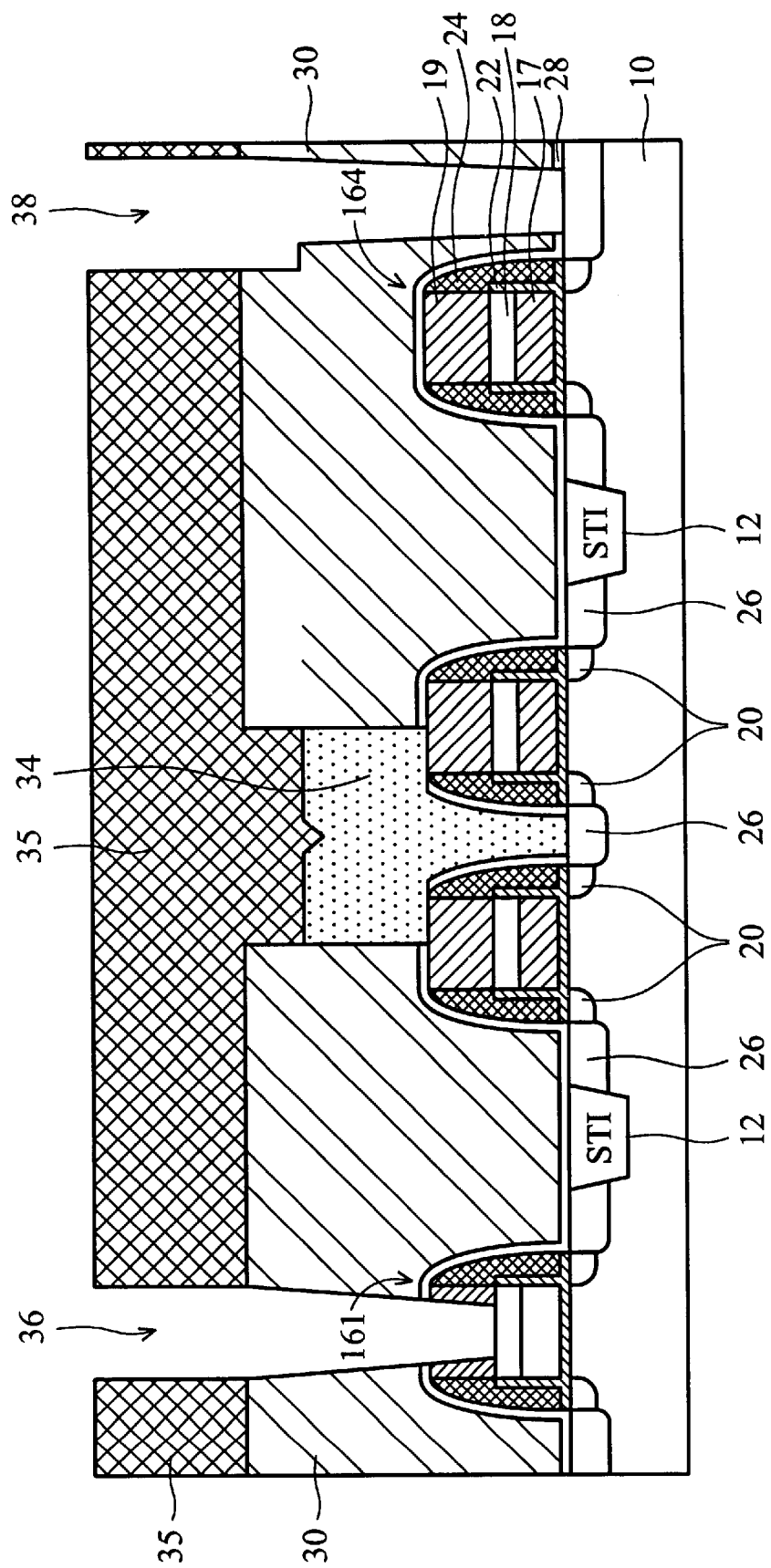
Figure 1G:
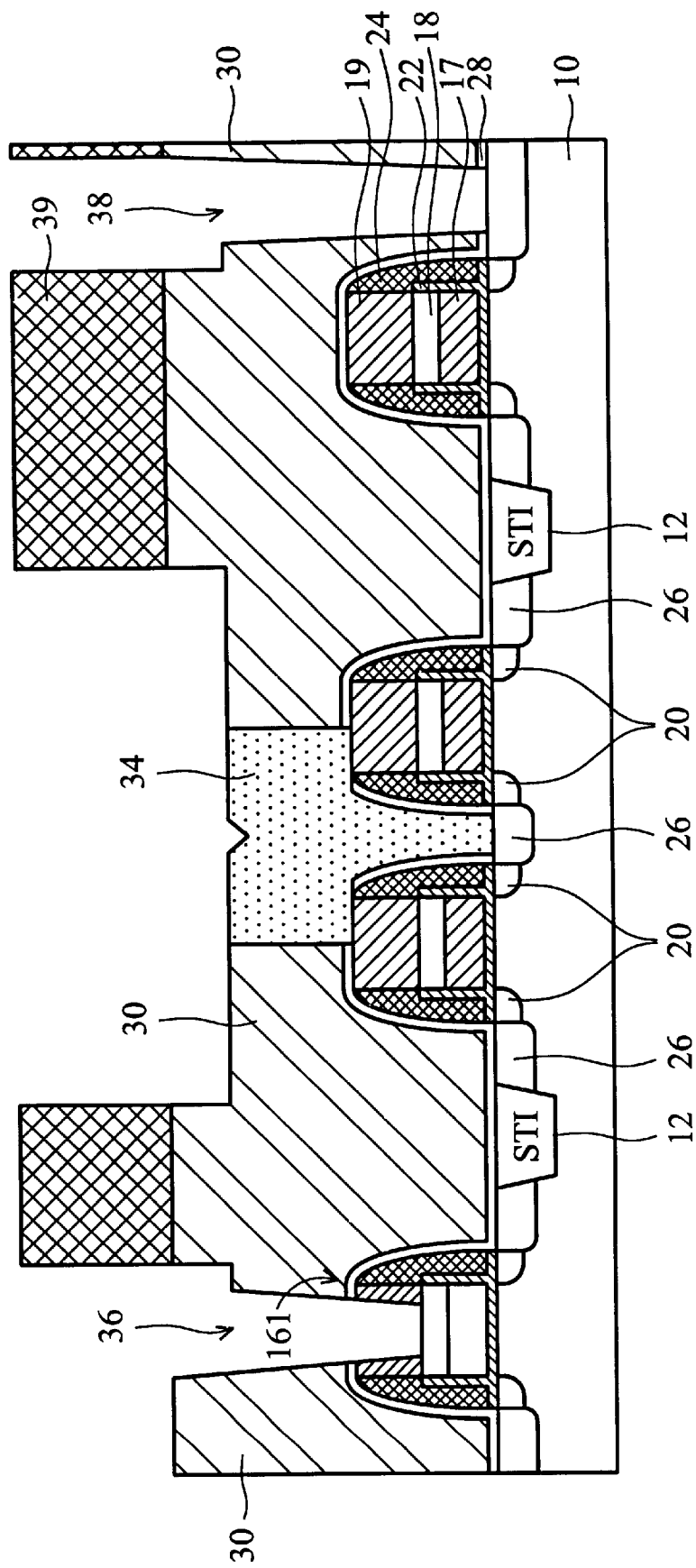
Figure 1H:
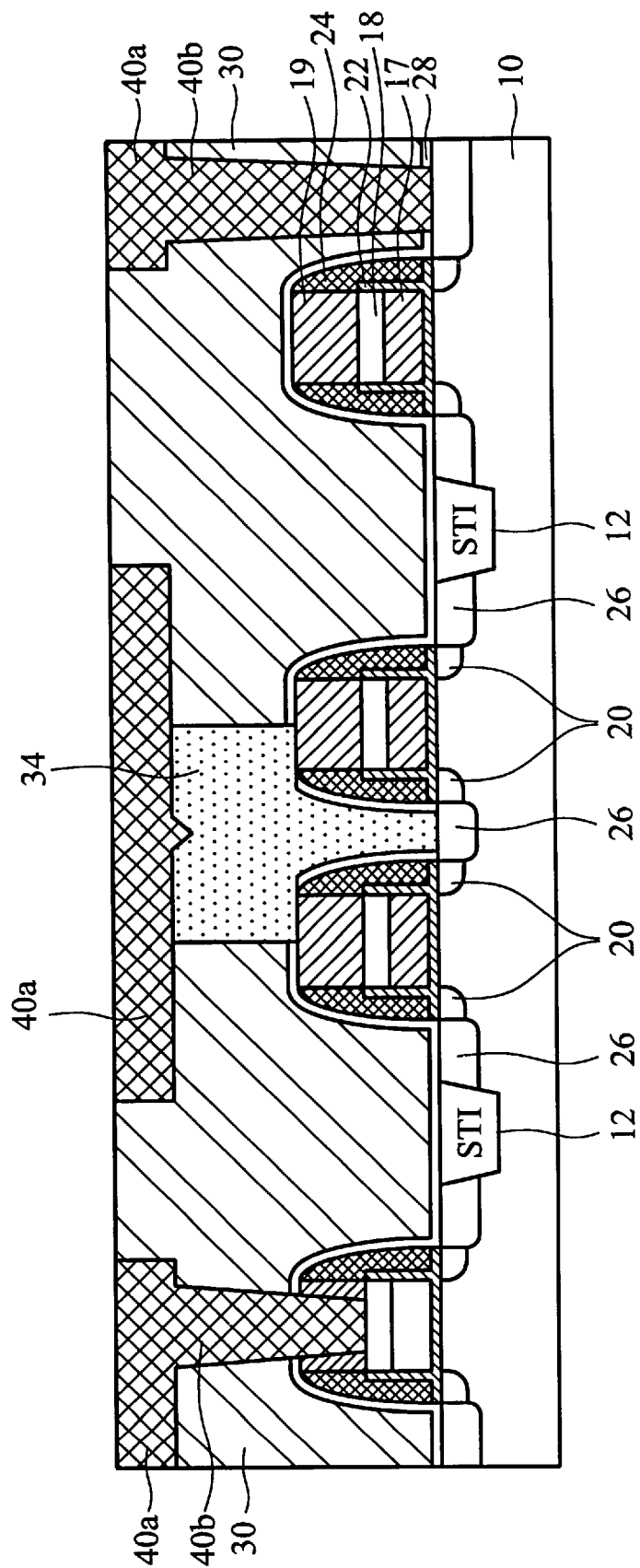
Figure 2A:
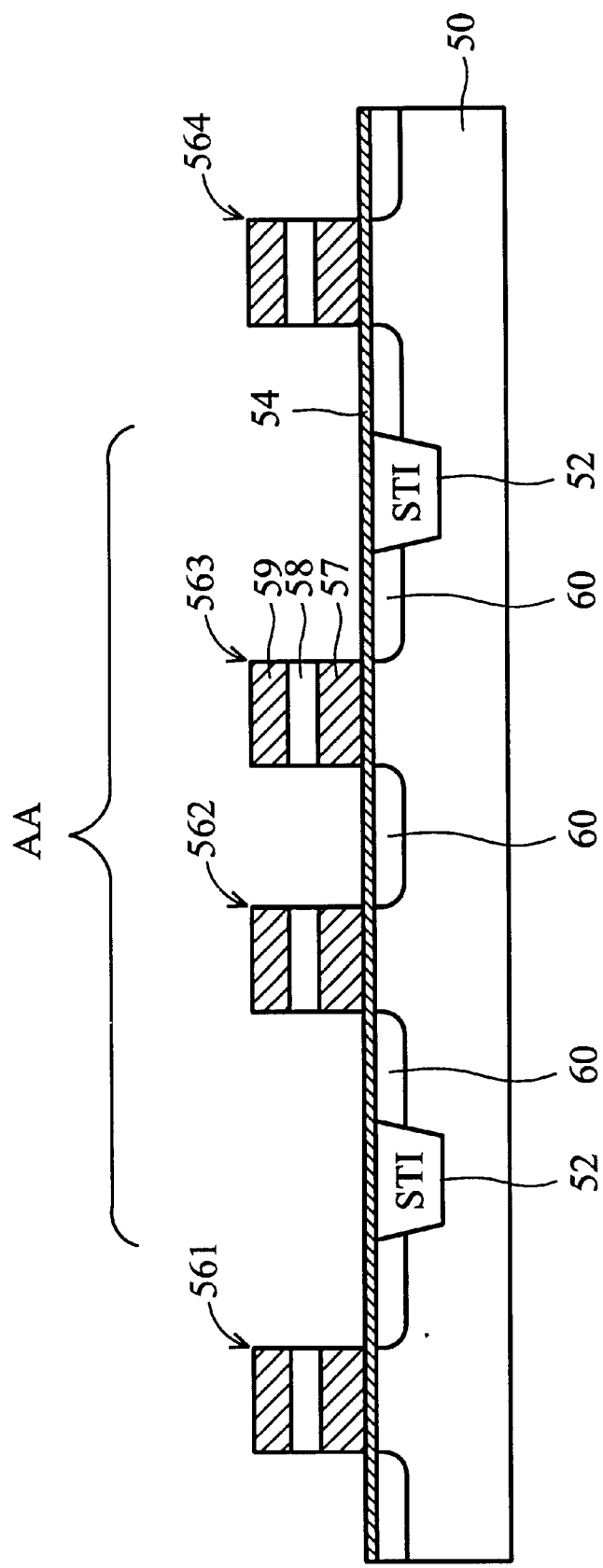
FIGS. 2A to 2J are sectional diagrams showing a method of forming contact plugs according to the present invention.

FIGS. 2A to 2J are sectional diagrams showing a method of forming contact plugs according to the present invention. As shown in FIG. 2A, a P-type silicon substrate 50 is provided with a plurality of STI regions 52 for isolating active areas, a gate insulating layer 54 formed on the substrate 50, a plurality of gate conducting structures 561, 562, 563 and 564 patterned on the gate insulating layer 54, and a plurality of $N^-$-type ion implantation regions 60 formed in the substrate 50 and at lateral regions of the gate conducting structures 561–564. Each of the gate conducting structures 561–564 is stacked by a polysilicon layer 57, a tungsten silicide layer 58 and a cap layer 59. Preferably, the material used to formed cap layer 59 is selected from SiN, SiON or silicon oxide.

Figure 2B:
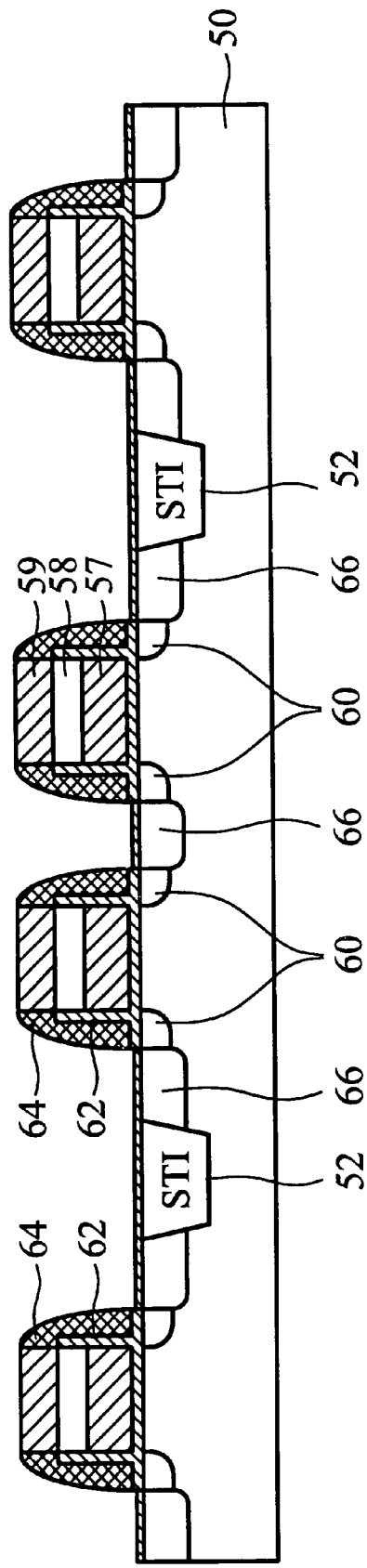

As shown in FIG. 2B, a first spacer 62 is formed on the exposed sidewalls of the polysilicon layer 57 and the tungsten silicide layer 58, and then a second spacer 64 is formed on the exposed sidewalls of the gate conducting structures 561–564. Preferably, the first spacer 62 is silicon oxide, and the second spacer 64 is selected from SiN, SiON or silicon oxide. Next, using the gate conducting structures 561–564 and the second spacer 64 as the mask, $N^+$-type ion implantation regions 66 are respectively formed in the exposed $N^-$-type ion implantation regions 60. Therefore, the $N^+$-type ion implantation region 66 serves as a source/drain region, and the $N^-$-type ion implantation region 60 serves as a lightly doped drain (LDD) structure.

Figure 2C:
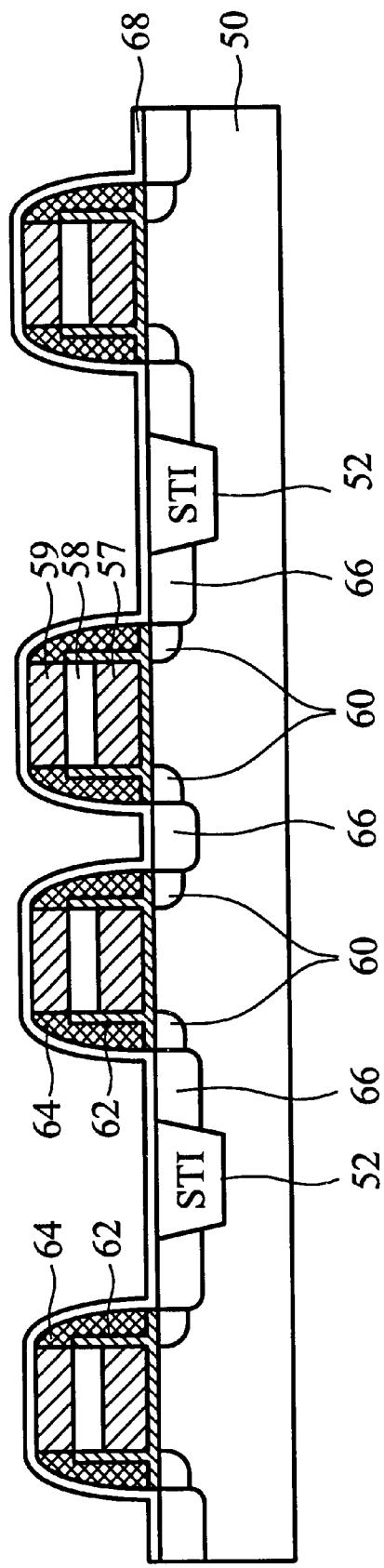
Figure 2D:
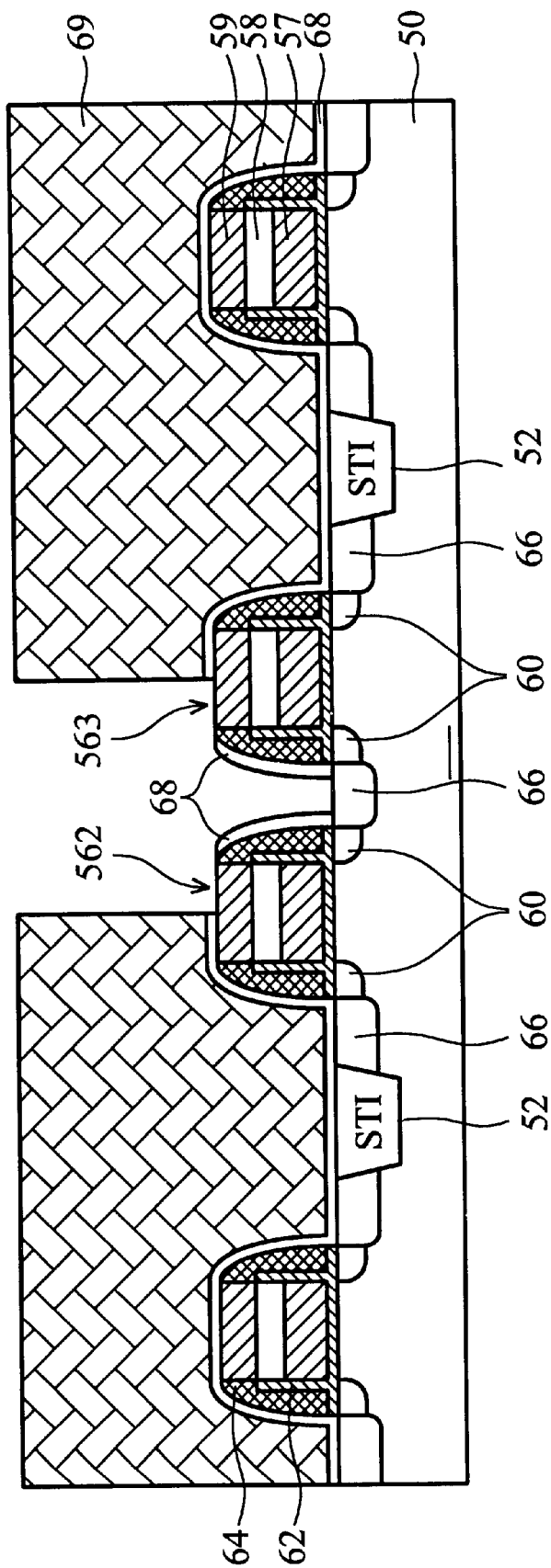
Figure 2E:
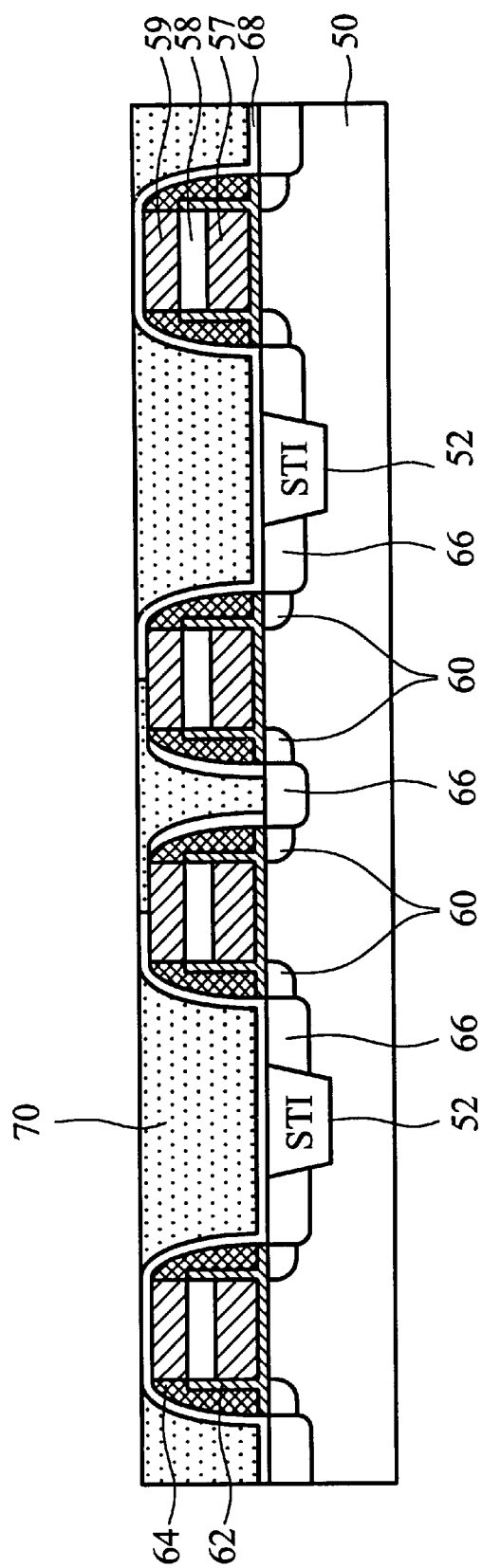
Figure 2F:
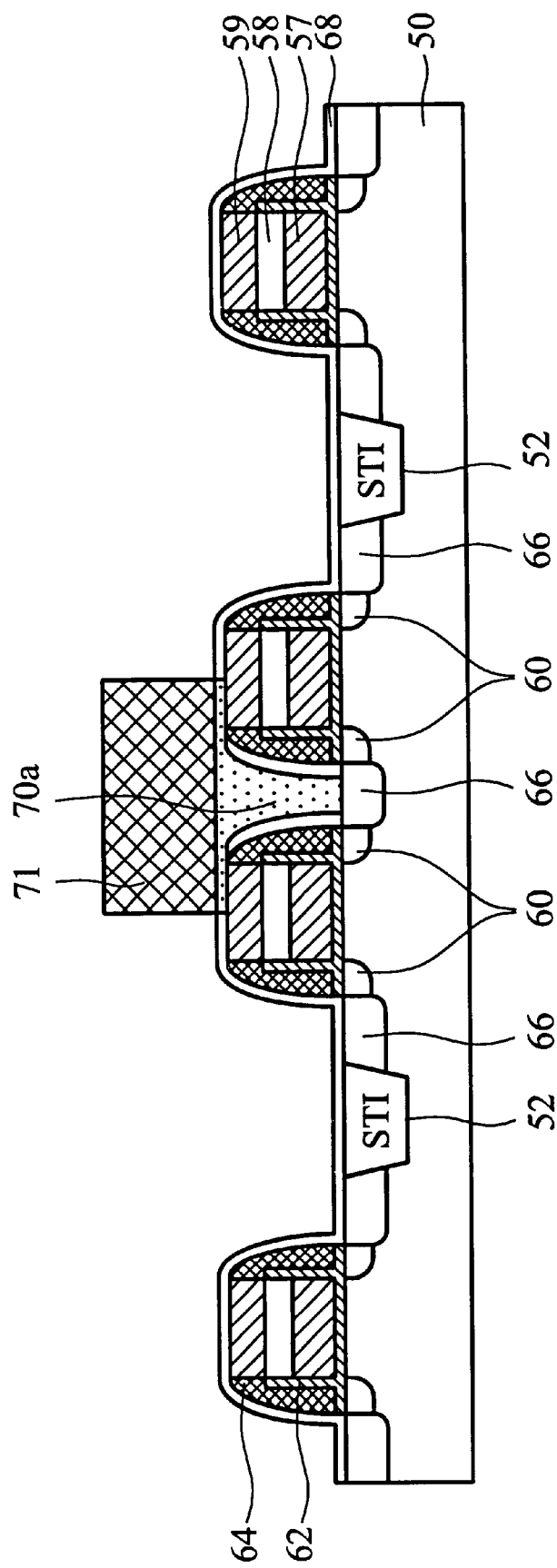

As shown in FIG. 2C, a liner 68 of SION, SiN or silicon oxide is deposited on the entire surface of the substrate 50. Then, as shown in FIG. 2D, using photolithography and etching with a first photoresist layer 69 as the mask, the liner 68 disposed on a part of the top of the second/third gate conducting structures 562/563 and disposed on the $N^+$-type ion implantation region 66 between the second gate conducting structure 562 and the third gate conducting structure 563 is removed. Next, as shown in FIG. 2E, after removing the first photoresist layer 69, a first conductive layer 70 with a planarized surface is formed on the entire surface of the substrate 50 by deposition and CMP. Preferably, the top of the first conductive layer 70 is equal to or higher than the top of the liner 68 remaining on the top of the gate conducting structures 561–564. The material used to form the first conductive layer 70 is polysilicon or any other conductive materials. Thereafter, as shown in FIG. 2F, using a second photoresist layer 71 as the mask and using the liner 68 as the etching stop layer, most of the first conductive layer 70 is removed, thus the first conductive layer 70 only remains in the gap between the second gate conducting structure 562 and the third gate conducting structure 563 to serve as a landing pad 70a.

Figure 2G:
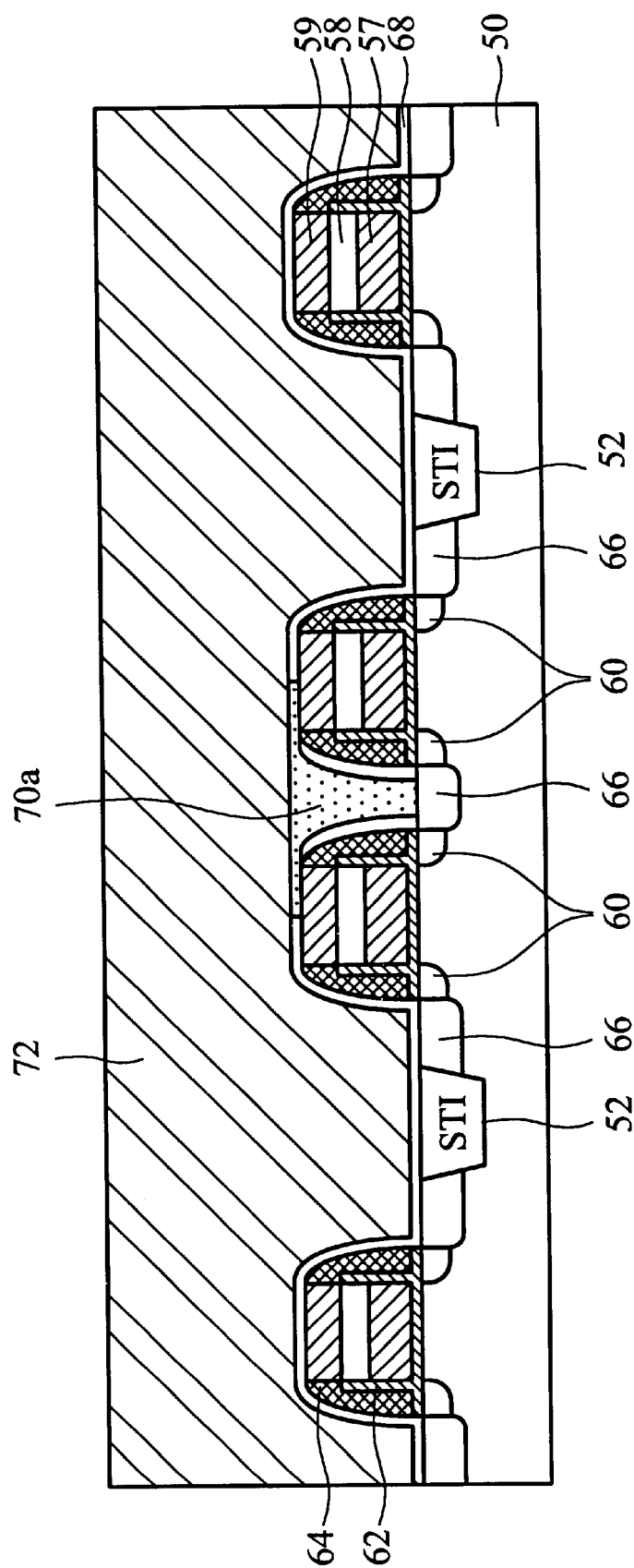
Figure 2H:
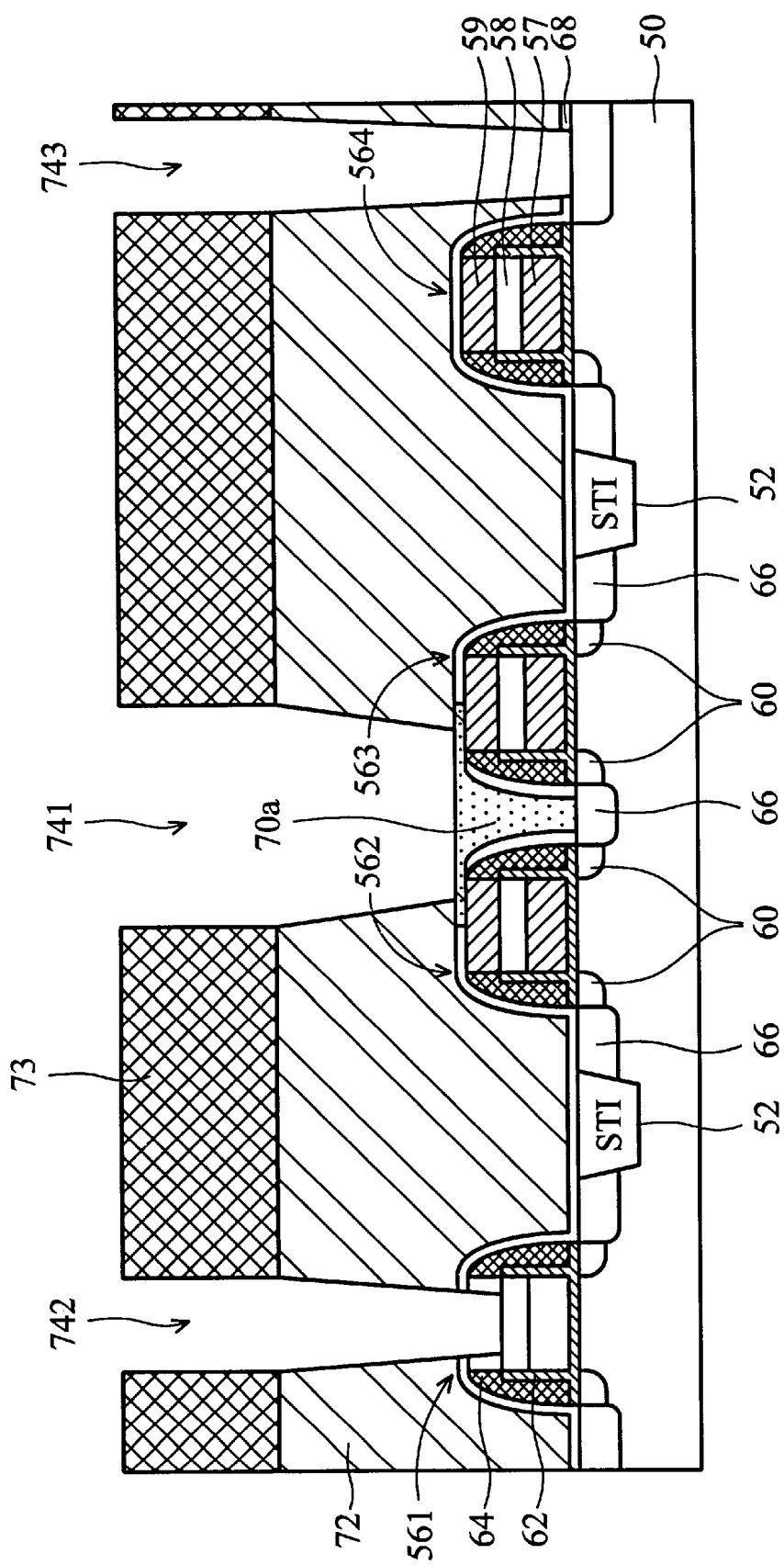

As shown in FIG. 2G, after removing the second photoresist layer 71, an ILD layer 72 with a planarized surface is formed on the entire surface of the substrate 50 to fill the gaps between adjacent gate conducting structures 561–564 by deposition and CMP. Preferably, the ILD layer 72 is BPSG, HDP oxide, TEOS oxide or the combination of those. Then, as shown in FIG. 2H, using a third photoresist layer 73 with a pattern of contact holes as the mask, part of the ILD layer 72, the SiON liner 68 and the cap layer 59 is removed to form a bitline contact hole 741, a first interconnection contact hole 742 and a second interconnection contact hole 743. The bitline contact hole 741 exposes the landing pad 70a between the second gate conducting structure 562 and the third gate conducting structure 563. The first interconnection contact hole 742 is over the first gate conducting structure 561 to expose the top of the tungsten silicide layer 58. The second interconnection contact hole 743 is outside the fourth gate conducting structure 564 to expose the $N^+$-type ion implantation region 66.

Figure 2I:
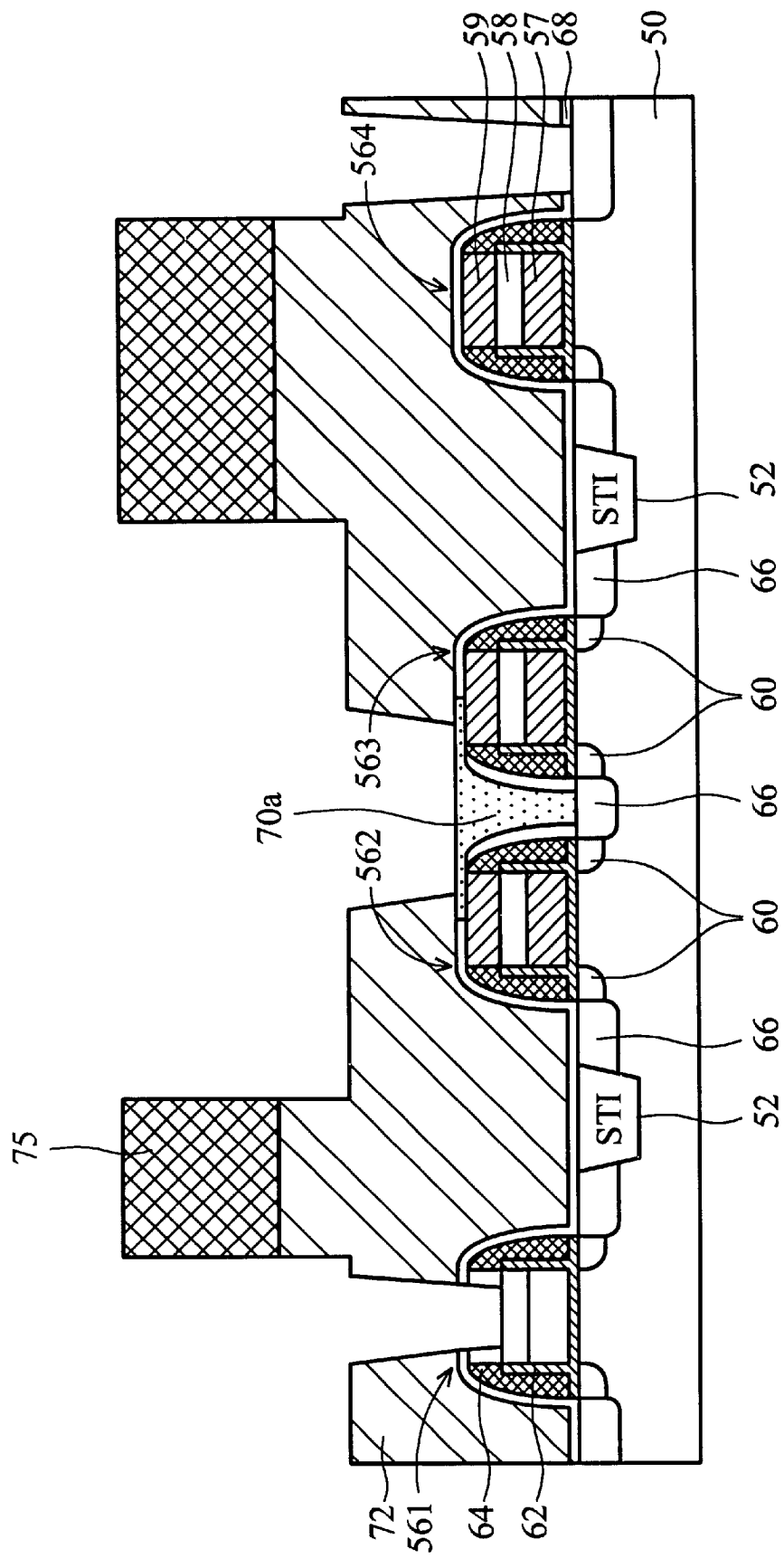
Figure 2J:
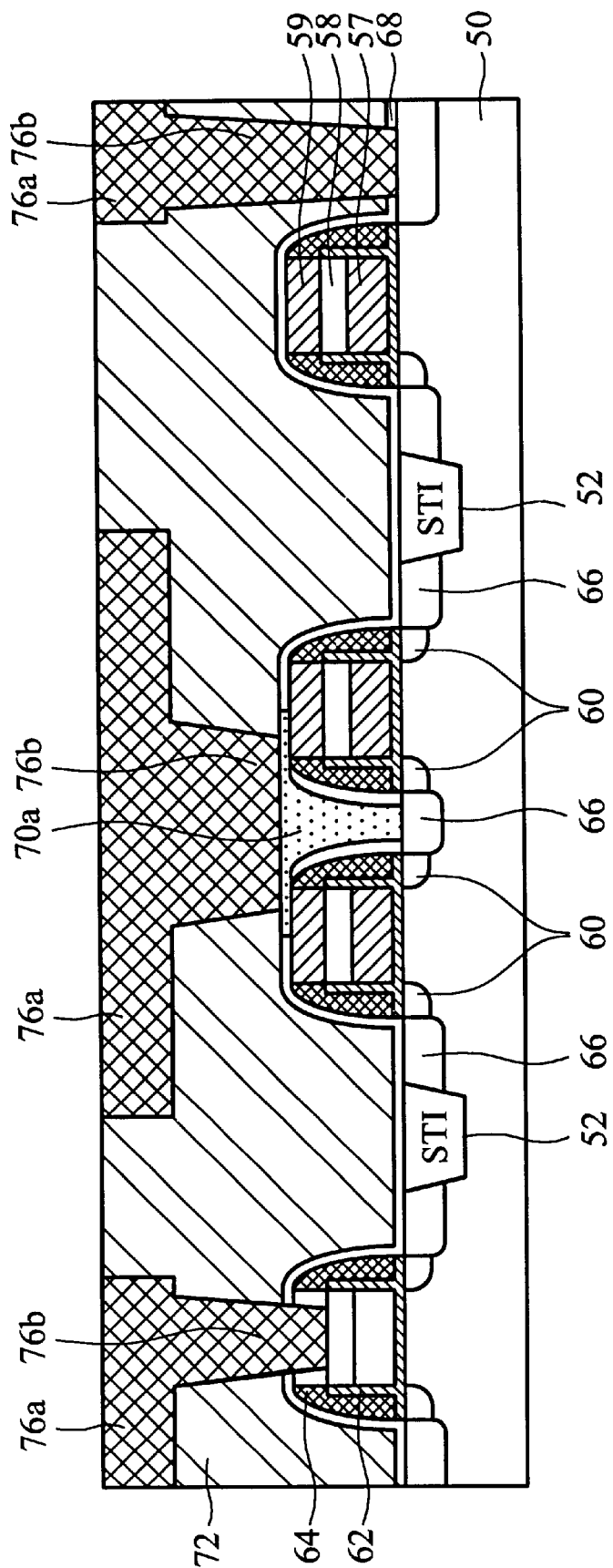

As shown in FIG. 2I, after removing the third photoresist layer 73, a fourth photoresist layer 75 with a pattern of interconnections is employed as the mask to remove part of the ILD layer 72. Finally, as shown in FIG. 2J, after removing the fourth photoresist layer 75, a second conductive layer 76 is deposited on the entire surface of the substrate 50 to fill the bitline contact hole 741, the first interconnection contact hole 742 and the second interconnection contact hole 743, and then CMP is used to level off the surfaces of the second conductive layer 76 and the ILD layer 72. Preferably, the second conductive layer 76 is polysilicon, tungsten or other conductive materials. The second conductive layer 76b remaining in the contact holes 741, 742 and 743 respectively serves as a bitline contact plug, a first interconnection contact plug and a second interconnection contact plug. The second conductive layer 76a remaining on the contact plugs serves as a bitline/ interconnection structure.

Compared with the prior art of forming the bitline contact hole, the present invention has advantages as listed below. First, since the etching selectivity from polysilicon to silicon oxide is high, the formation of the bitline contact hole 741 over the landing pad 70a avoids the problems of poor etching profile, short circuits in the interconnection structure and blind window caused by conventional SAC process. Second, the first photoresist layer 69 is used as the mask to remove the liner 68 between the second gate conducting layer 562 and the third conducting layer 563, thus the recess depth of the exposed silicon cannot be large to prevent the formation of seams in the STI region 52. This prevents junction leakage between the substrate 50 and the contact plug 76b. Third, a good ohmic contact is formed between the bitline contact plug 76b, the landing pad 70a and the substrate 50 to provide a stable contact resistance. Fourth, the cap layer 59 of a thinner thickness is employed to reduce thermal budget and promote electrical properties of the product. Fifth, the present invention can be applied to manufacture a device of a further reduced size without encountering problems in photolithography. Sixth, the materials used for the cap layer 59 and the second spacer 64 are not only SiN and SiON, but also silicon oxide. This increases the selectiveness of using materials to form the cap layer 59 and the second spacer 64. In a preferred embodiment, when the liner 68 is silicon nitride, the ILD layer 72 is BPSG. In another preferred embodiment, when the liner 68 is silicon oxide, the material used to form the ILD layer 72 is selected from dielectric materials not containing boron and phosphorous. This prevents the boron ions or phosphorous ions from diffusing into the substrate 50 so as to ensure the device stability.

It is to be understood that the present invention is not limited to the embodiments described above, but encompasses any and all embodiments within the scope of the following claims.

What is claimed is:

1. A method of forming contact plugs, comprising steps of:
   (a) providing a semiconductor substrate having a first gate conducting structure, a second gate conducting structure, a third gate conducting structure and a fourth gate conducting structure arranging in sequence, wherein the second gate conducting structure and the third gate conducting structure are formed within an active area;
   (b) filling the gap between the second gate conducting structure and the third gate conducting structure with a first conductive layer;
   (c) forming an inter-layered dielectric (ILD) layer with a planarized surface on the entire surface of the substrate to cover the first conductive layer and fill the gap between the first gate conducting structure and the second gate conducting structure and the gap between the third gate conducting structure and the fourth gate conducting structure;
   (d) forming a bitline contact hole in the ILD layer to expose the first conductive layer;
   (e) filling the bitline contact hole with a second conductive layer to serve as a bitline contact plug.

2. The method according to claim 1, wherein the first conductive layer is polysilicon.

3. The method according to claim 1, wherein the formation of the first conductive layer comprises steps of:
   (b1) depositing the first conductive layer on the entire surface of the substrate;
   (b2) using chemical mechanical polishing (CMP) to planarize the surface of the first conductive layer until the top of the first conductive layer reaches a height equal to or slightly higher than the top of each gate conducting structure; and
   (b3) using photolithography and etching to remove most of the first conductive layer, wherein the first conductive layer only remains between the second conductive structure and the third conductive structure.

4. The method according to claim 1, wherein each of the gate conducting structures comprises a gate electrode layer and a cap layer.

5. The method according to claim 4, wherein the material used to form the cap layer is selected from the group consisting of SiN, SiON and silicon oxide.

6. The method according to claim 1, wherein the material used to form the ILD layer is selected from the group consisting of BPSG, HDP oxide and TEOS oxide.

7. The method according to claim 1, wherein the step (d) forms a first interconnection contact hole and a second interconnection contact hole in the ILD layer at the same time that the bitline contact hole is formed, wherein the first interconnection contact hole exposes the top of the first gate conducting structure and the second interconnection contact hole exposes the substrate outside the fourth gate conducting structure.

8. The method according to claim 7, wherein the step (e) fills the first interconnection contact hole and the second interconnection contact hole with the second conductive layer to serve as a first interconnection contact plug and a second interconnection contact plug.

9. The method according to claim 1, wherein the substrate comprises a first shallow trench isolation (STI) region between the first gate conducting structure and the second gate conducting structure, and a second STI region between the third gate conducting structure and the fourth gate conducting structure, wherein the first STI region and the second STI region defines the active area.

10. The method according to claim 1, wherein before the step (b) of providing the first conductive layer, the method further comprises the steps of:
    forming a liner on the entire surface of the substrate;
    removing the liner disposed on the top of the second gate conducting structure and the third gate conducting structure and the liner disposed on the substrate between the second gate conducting structure and the third gate conducting structure; and
    filling the gap between the second gate conducting structure and the third gate conducting structure with a first conductive layer.

11. The method according to claim 10, wherein the material used to form the liner is selected from the group consisting of SiN, SiON and silicon oxide.

* * * * *